United States Patent
Tan et al.

(10) Patent No.: US 11,264,427 B2
(45) Date of Patent: Mar. 1, 2022

(54) OPTOELECTRONIC DEVICE WITH LIGHT-EMITTING DIODES

(71) Applicant: Aledia, Grenoble (FR)

(72) Inventors: Wei Sin Tan, Meylan (FR); Philippe Gilet, Teche (FR); Zine Bouhamri, Grenoble (FR); Pamela Rueda Fonseca, Grenoble (FR)

(73) Assignee: Aledia, Echirolles (FR)

( * ) Notice: Subject to any disclaimer, the term of this patent is extended or adjusted under 35 U.S.C. 154(b) by 46 days.

(21) Appl. No.: 16/626,269

(22) PCT Filed: Jun. 21, 2018

(86) PCT No.: PCT/EP2018/066669
§ 371 (c)(1),
(2) Date: Dec. 23, 2019

(87) PCT Pub. No.: WO2019/002102
PCT Pub. Date: Jan. 3, 2019

(65) Prior Publication Data
US 2020/0357844 A1   Nov. 12, 2020

(30) Foreign Application Priority Data

Jun. 30, 2017 (FR) .................................. 1756145

(51) Int. Cl.
*H01L 27/15* (2006.01)
*H01L 23/00* (2006.01)
*H01L 25/18* (2006.01)

(52) U.S. Cl.
CPC ............ *H01L 27/156* (2013.01); *H01L 24/08* (2013.01); *H01L 24/16* (2013.01); *H01L 24/80* (2013.01);
(Continued)

(58) Field of Classification Search
None
See application file for complete search history.

(56) References Cited

U.S. PATENT DOCUMENTS

2007/0284566 A1   12/2007   Tada et al.
2011/0095260 A1    4/2011   Kim
(Continued)

FOREIGN PATENT DOCUMENTS

| FR | 3 023 066 A1 | 1/2016 | |
|---|---|---|---|
| WO | WO 2015/044620 A1 | 4/2015 | |
| WO | WO-2015044620 A1 * | 4/2015 | ............. H01L 33/18 |

OTHER PUBLICATIONS

PCT/EP2018/066669, Sep. 4, 2018, International Search Report and Written Opinion.
(Continued)

*Primary Examiner* — Telly D Green
(74) *Attorney, Agent, or Firm* — Wolf, Greenfield & Sacks, P.C.

(57) ABSTRACT

An optoelectronic circuit including a substrate and display pixels, each display pixel having a first light-emitting diode adapted to emit a first radiation and a second light-emitting diode adapted to emit a second radiation, the first light-emitting diode having a planar structure and resting on the substrate and the second light-emitting diode having a tridimensional structure and resting on the first light-emitting diode or crossing at least partially through the first light-emitting diode.

12 Claims, 12 Drawing Sheets

(52) U.S. Cl.
CPC .... *H01L 25/18* (2013.01); *H01L 2224/08146* (2013.01); *H01L 2224/16145* (2013.01); *H01L 2224/80203* (2013.01)

(56) References Cited

U.S. PATENT DOCUMENTS

| | | |
|---|---|---|
| 2017/0133553 A1 | 5/2017 | Kong et al. |
| 2017/0323925 A1* | 11/2017 | Schneider, Jr ........ H01L 27/156 |
| 2018/0277717 A1* | 9/2018 | Amstatt .............. H01L 31/0264 |

OTHER PUBLICATIONS

International Search Report and Written Opinion for International Application No. PCT/EP2018/066669, dated Sep. 4, 2018.

\* cited by examiner

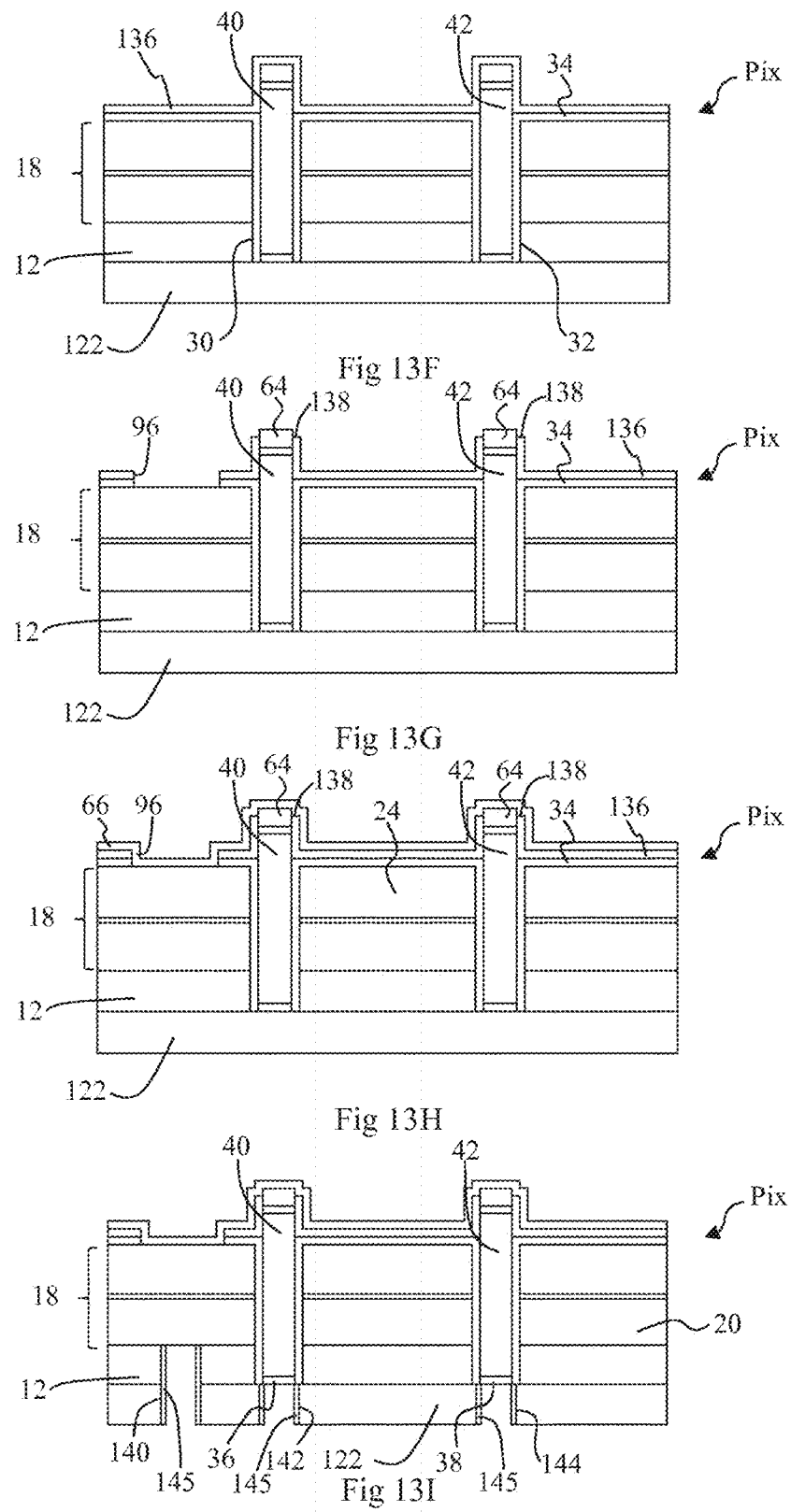

OPTOELECTRONIC DEVICE WITH LIGHT-EMITTING DIODES

RELATED APPLICATIONS

This Application is a national stage filing under 35 U.S.C. § 371 of International Patent Application Serial No. PCT/EP2018/066669, filed Jun. 21, 2018, which claims priority to French patent application FR 17/56145. The contents of these applications are incorporated herein by reference in their entirety.

BACKGROUND

The present disclosure relates to an optoelectronic device, particularly a display screen or an image projection device, with light-emitting diodes based on semiconductor materials and their manufacturing methods.

DISCUSSION OF THE RELATED ART

A pixel of an image corresponds to the unit element of the image displayed by an optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superimposing of the radiations emitted by the three display sub-pixels provides the observer with the color sensation corresponding to the pixel of the displayed image. In this case, the assembly formed by the three sub-display pixels used to display a pixel of an image is called a display pixel.

There exist optoelectronic devices comprising light-emitting diodes based on semiconductor materials, each diode comprising a stack of semiconductor layers for example mainly comprising at least one group-III element and one group-V element, called III-V compound hereafter, particularly gallium nitride (GaN), or mainly comprising at least one group-II element and one group-VI element, particularly zinc oxide (ZnO), called II-VI compound hereafter.

When the light-emitting diodes are made by epitaxy on the same substrate, it can be complicated to form, for each display pixel, light-emitting diodes emitting radiations at different wavelengths.

Moreover, when the lateral dimension of the display pixel, also called pixel pitch, is less than 10 µm, it can be difficult to manufacture three diodes emitting radiations by display pixel.

Moreover, known light-emitting diodes comprising a stack of semiconductor layers, for example comprising a III-V or II-VI compound, and emitting a red light can show poor internal quantum efficiency (IQE) for conventional III-V or II-VI based structures, in particular when the pixel pitch is less than 10 µm.

SUMMARY

An object of an embodiment aims at overcoming all or part of the disadvantages of the previously-described optoelectronic devices comprising light-emitting diodes.

Another object of an embodiment is that the light-emitting diodes comprise a stack of semiconductor layers, for example mainly comprising a III-V or II-VI compound.

Another object of an embodiment is that the pixel pitch of the optoelectronic device is less than 10 µm.

Another object of an embodiment is that the method of manufacturing a tri-color optoelectronic device is simplified.

Another object of an embodiment is that the optoelectronic device can be manufactured at an industrial scale and at a low cost.

Another object of an embodiment is that the method for manufacturing the optoelectronic device comprises the manufacture of the light-emitting diodes by epitaxy.

Another object of an embodiment is that the internal quantum efficiency of the red light-emitting diodes of the optoelectronic device is increased.

Thus, an embodiment provides an optoelectronic circuit comprising a substrate and display pixels, each display pixel comprising a first light-emitting diode adapted to emit a first radiation and a second light-emitting diode adapted to emit a second radiation, the first light-emitting diode having a planar structure and resting on the substrate and the second light-emitting diode having a tridimensional structure and resting on the first light-emitting diode or crossing at least partially through the first light-emitting diode.

According to an embodiment, each display pixel further comprises a third light-emitting diode adapted to emit a third radiation, having a tridimensional structure and resting on the first light-emitting diode or crossing at least partially through the first light-emitting diode.

According to an embodiment, one of the first, second and third radiations is at a wavelength in the range from 600 nm to 720 nm, another one of the first, second and third radiations is in the range from 510 nm to 570 nm and another one of the first, second and third radiations id in the range from 430 nm to 490 nm.

According to an embodiment, the substrate comprises opposite first and second faces, the first light-emitting diode comprising a first active region adapted to emit the first radiation, the second light-emitting diode comprising a second active region adapted to emit the second radiation, and the surface area, viewed from a direction orthogonal to the first face, of the first active region is at least twice as big as the surface area, viewed from said direction, of the second active region.

According to an embodiment, the first light-emitting diode comprises first and second semiconductor planar layers, first active region being sandwiched between first and second semiconductor planar layers and the second light-emitting diode comprises a tridimensional semiconductor element, second active region covering at least partially the tridimensional semiconductor element, the tridimensional element resting on the first light-emitting diode or crossing at least partially through the first light-emitting diode.

According to an embodiment, the first semiconductor planar layer is in contact with the substrate and each display pixel comprises an opening extending through the second semiconductor planar layer, through the first active region and partially through the first semiconductor planar layer, the tridimensional semiconductor element extending at least inside the opening.

According to an embodiment, the optoelectronic circuit comprises an electrically conductive layer covering the second light-emitting diode and electrically connected to the second light-emitting diode.

According to an embodiment, the electrically conductive layer is further in contact with the first light-emitting diode.

According to an embodiment, the first light-emitting diode and the second light-emitting diode comprise at least one quantum well.

According to an embodiment, each display pixel comprises an electrically conductive element extending through the substrate and electrically linked to the second light-emitting diode.

According to an embodiment, each display pixel further comprises a metallic wall laterally surrounding at least part of the second light-emitting diode.

According to an embodiment, each display pixel further comprises an electrically insulating layer interposed between the metallic wall and the second light-emitting diode.

An embodiment also provides an optoelectronic device comprising the optoelectronic circuit previously defined and comprising an additional circuit bounded to the optoelectronic circuit on the side of the substrate opposite to the first light-emitting diode.

An embodiment also provides a method of manufacturing an optoelectronic circuit comprising a substrate and display pixels, the method comprising for each display pixel the successive steps of:

forming on the substrate a first light-emitting diode adapted to emit a first radiation and having a planar structure; and forming a second light-emitting diode adapted to emit a second radiation, having a tridimensional structure and resting on the first light-emitting diode or crossing at least partially through the first light-emitting diode.

According to an embodiment, the first and second light-emitting diodes are formed by epitaxy.

BRIEF DESCRIPTION OF THE DRAWINGS

The foregoing and other features and advantages will be discussed in detail in the following non-limiting description of specific embodiments in connection with the accompanying drawings, among which:

FIGS. 13A to 13K are partial simplified cross-section views of the structures obtained at successive steps of an embodiment of a method of manufacturing optoelectronic device shown in FIG. 10.

DETAILED DESCRIPTION

Figure 1:
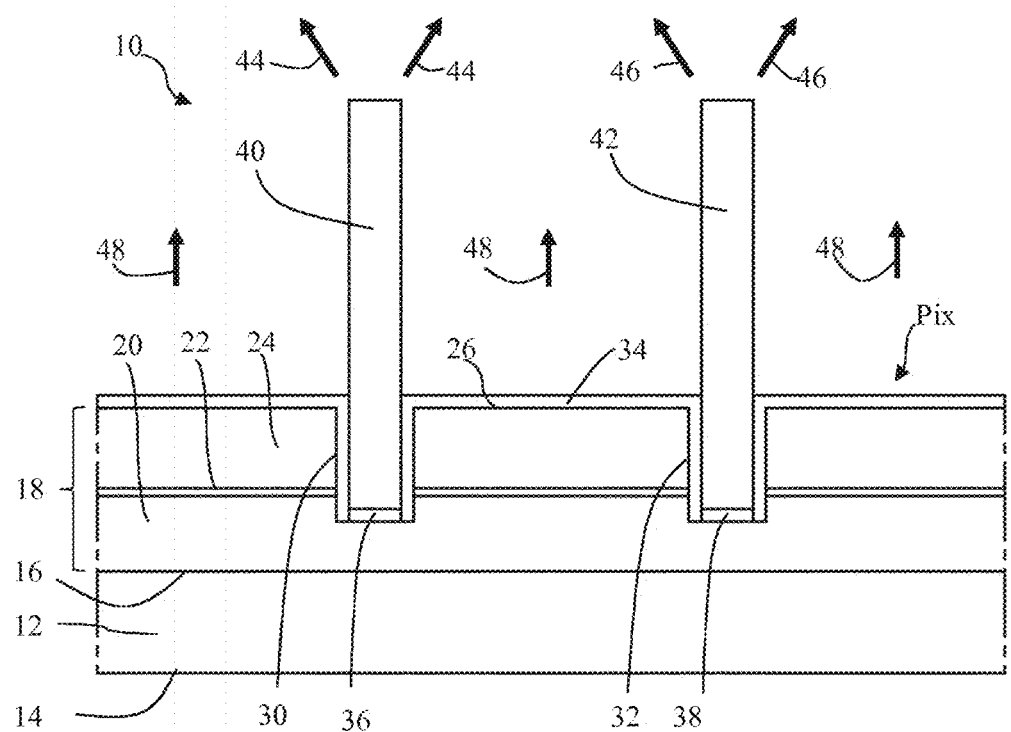
FIGS. 1 and 2 are respectively a partial simplified cross-section view and a partial simplified top view of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the circuits for controlling a light-emitting diode of an optoelectronic device are well known and will not be described in detail.

In the following description, unless otherwise indicated, terms "substantially", "approximately", and "in the order of" mean "to within 10%". Moreover, "active region" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

A light-emitting diode is said to have a planar structure or a bidimensional structure when the active region of the light-emitting diode is formed over a planar layer. A light-emitting diode is said to have a tridimensional structure when the active region of the light-emitting diode covers a tridimensional element, for example a microwire or a nanowire.

Term "microwire" or "nanowire" designates a three-dimensional structure of elongated shape along a preferred direction, having at least two dimensions, called minor dimensions, in the range from 5 nm to 5 µm, preferably from 100 nm to 2 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 5 µm, preferably in the range from 100 nm to 5 µm, more preferably from 200 nm to 1.5 µm. In certain embodiments, the height of each microwire or nanowire may be greater than or equal to 500 nm, preferably in the range from 1 µm to 50 µm. In the following description, term "wire" is used to mean "microwire or nanowire".

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire designates a quantity associated with the surface area of the wire in this cross-section, corresponding, for example, to the diameter of the disk having the same surface area as the wire cross-section.

According to an embodiment, the optoelectronic circuit comprises, for each display pixel, at least first and second light-emitting diodes formed from the same substrate. The first light-emitting diode is a planar light-emitting diode that is embedded inside the optoelectronic circuit and the second light-emitting diode being is a tridimensional light-emitting diode covering the first light-emitting diode. For each display pixel, a third tridimensional light-emitting diode can also be provided covering the first light-emitting diode. The manufacture of a display pixel having a pixel pitch inferior to 10 µm is easier since the light-emitting diodes are stacked.

The surface area of the active region of the first light-emitting diode can be made bigger than the surface area of the active region of the second light-emitting diode, for example as big as the surface area of the display pixel. When the first light-emitting diode is a red light-emitting diode, the quantum efficiency of the red light-emitting diode remains high, for example higher than 10%, even when the pixel pitch is inferior to 10 µm.

FIG. 1 shows an embodiment of a display pixel Pix of an optoelectronic circuit 10, for example corresponding to a display screen or to an image projection device.

In an embodiment, optoelectronic circuit 10 comprises for each display pixel Pix:

a substrate 12 having two opposite, preferably planar, faces 14, 16;

first light-emitting diode 18 covering face 16 and comprising a first semiconductor layer 20 of a first semiconductor material doped with a first conductivity type in contact with face 16, an active region 22 having the shape of a layer covering semiconductor layer 20 and in contact with semiconductor layer 20 and a second semiconductor layer 24 of the first semiconductor material doped with a second conductivity type opposite to the first conductivity type and covering active region 22 and in contact with active region 22, second semiconductor layer 24 delimiting an upper face 26;

two openings 30, 32 crossing completely through second semiconductor layer 24 from face 26, completely through active region 22 and partially through first semiconductor layer 20;

an electrically insulating layer 34 covering upper face 26 and the lateral sides of openings 30, 32;

a seed pad 36, 38 at the bottom of each opening 30, 32 and with an epitaxial relationship with semiconductor layer 20;

a second light-emitting diode 40 on seed pad 36; and a third light-emitting diode 42 on seed pad 38.

As a variation, openings 30, 32 can only extend partially through semiconductor layer 24 so that seed pads 36, 38 are in an epitaxial relationship with semiconductor layer 24.

In the present embodiment, light-emitting diodes 40, 42 have a tridimensional structure and light-emitting diode 18 has a planar structure. In FIG. 1, the electrodes of light-emitting diodes 18, 40, 42 are not shown. In operation, light emitted by light-emitting diodes 40, 42 escapes upwards in FIG. 1 as shown respectively by arrows 44, 46. Light emitted by light-emitting diode 18 escapes upwards in FIG. 1 as shown by arrows 48. As a variation, seed pads 36, 38 may not be present.

Figure 2:
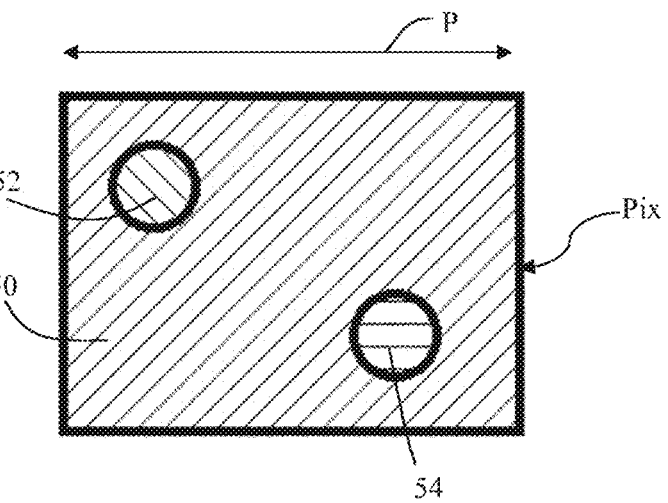

FIG. 2 is a top view of display pixel Pix and schematically shows by hatched areas 50, 52, 54 the areas of pixel Pix from which light, emitted respectively by light-emitting diodes 18, 40, 42, escapes from pixel Pix. In the present embodiment, display pixel Pix has, in top view, a circle, triangle, hexagonal, square or rectangular shape. The pixel pitch P can correspond to the longest side of the rectangle in which display pixel Pix is inscribed in top view. The pixel pitch P can be ranging from 3 µm to 100 µm. In an embodiment, the surface area view from a direction orthogonal to face 16 of active region 22 of light-emitting diode 18 is at least twice, preferably at least five times, most preferably at least ten times, as big as the surface area view from said direction of the active region of light-emitting diode 40 or 42. In an embodiment, the surface area view from a direction orthogonal to face 16 of active region 22 of light-emitting diode 18 is substantially equal to the surface area of display pixel Pix. In an embodiment, in top view of FIG. 2, each area 52, 54 can be inscribed in a circle having a diameter ranging from 1 µm to 100 µm, preferably from 3 µm to 15 µm.

In an embodiment, light-emitting diode 18 is adapted to emit light at a first wavelength by electrical pumping. Light-emitting diode 40 is adapted to emit light at a second wavelength by electrical pumping. Light-emitting diode 42 is adapted to emit light at a third wavelength by electrical pumping. In an embodiment, first, second and third wavelengths are different. In an embodiment, one of the first, second or third wavelengths corresponds to red light and is in a range from 600 nm to 720 nm. In an embodiment, another one of the first, second or third wavelengths corresponds to green light and is in the range from 510 nm to 570 nm. In an embodiment, another one of the first, second or third wavelengths corresponds to blue light and is in the range from 430 nm to 490 nm. Preferably, first wavelength corresponds to red light and is in a range from 600 nm to 720 nm In an embodiment, each pixel Pix of optoelectronic circuit 10 comprises an additional light-emitting diode having a general structure similar to light-emitting diodes 40, 42, and adapted to emit light at a fourth wavelength by electrical pumping. In an embodiment, fourth wavelength corresponds to yellow light and is in a range from 570 nm to 600 nm.

Figure 3:
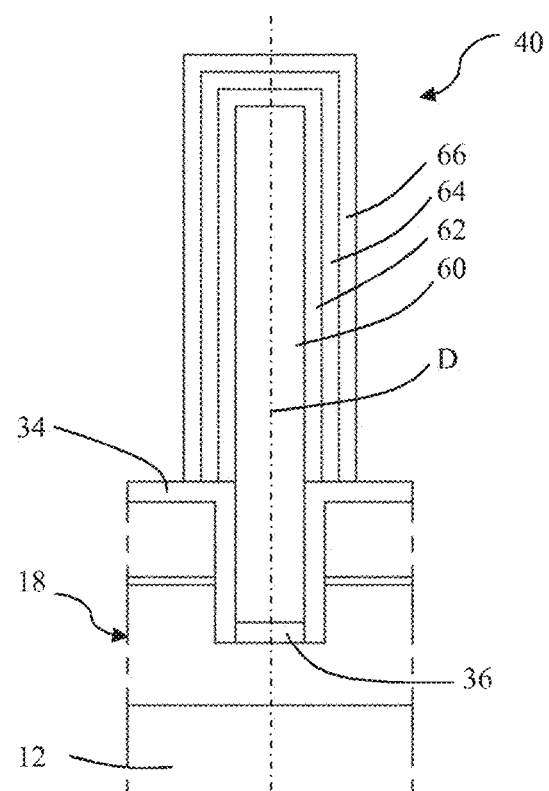
FIGS. 3 and 4 are partial simplified cross-section views of embodiments of tridimensional light-emitting diodes.

FIG. 3 shows an embodiment of tridimensional light-emitting diode 40. Light-emitting diode 42 can have the same structure.

Light-emitting diode 40 comprises, from the bottom to the top in FIG. 3:

a three-dimensional semiconductor element 60, which in the present embodiment correspond to a wire of axis D, comprising a lower portion, doped of a first conductivity type, for example of N type, in contact with seed pad 36, and an upper portion, doped with the first conductivity type or unintentionally doped, the insulating layer 34 covering the side walls of the lower portion of wire 60;

an active region 62 covering the upper portion of wire 60;

a semiconductor layer 64 of a second type of conductivity opposite to the first conductivity type, overlying the active region 62; and an electrically conductive layer 66 covers semiconductor layer 64 and is in contact with semiconductor layer 64.

Conductive layer 66 forms an electrode of light-emitting diode 40. Conductive layer 66 may extend over insulating layer 34. As a variation, an electrically insulating layer can extend around an inferior lateral portion of wire 60 from insulating layer 34 and in contact with wire 60. In the following description, an apostrophe is added to the reference designating an element of light-emitting diode 40 to distinguish it from the reference designating the same element of light-emitting diode 42.

In FIG. 3, light-emitting diode 40 is said to be in a radial configuration, or in a core/shell configuration, since active region 62 is formed at the periphery of three-dimensional semiconductor element 60. The active region of a light-emitting diode in radial configuration can advantageously have a high surface area.

Figure 4:
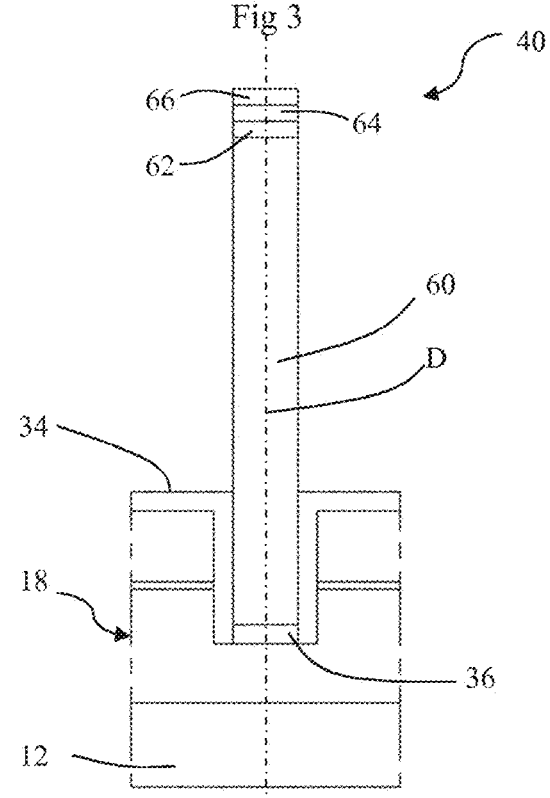

FIG. 4 shows another embodiment of tridimensional light-emitting diode 40 in which the active region 62 only covers the tip of wire 60 opposite to seed pad 36 and does not cover the lateral faces of wire 60. In FIG. 4, light-emitting diode 40 is said to be in an axial configuration, since active region 62 is formed along the axis D of three-dimensional semiconductor element 60. Three-dimensional light-emitting diodes in axial configuration have an active region with a lower surface area than light-emitting diodes in radial configuration, but have the advantage of being made of a semiconductor material of better crystalline quality, thus offering a higher internal quantum efficiency, in particular, because of a better relaxation of the mechanical stresses at the interfaces between the semiconductor layers. In the case of quantum wells made of InGaN, the three-dimensional light-emitting diodes in axial configuration thus enable more indium to be incorporated to emit, for example in red or green.

Figure 5:
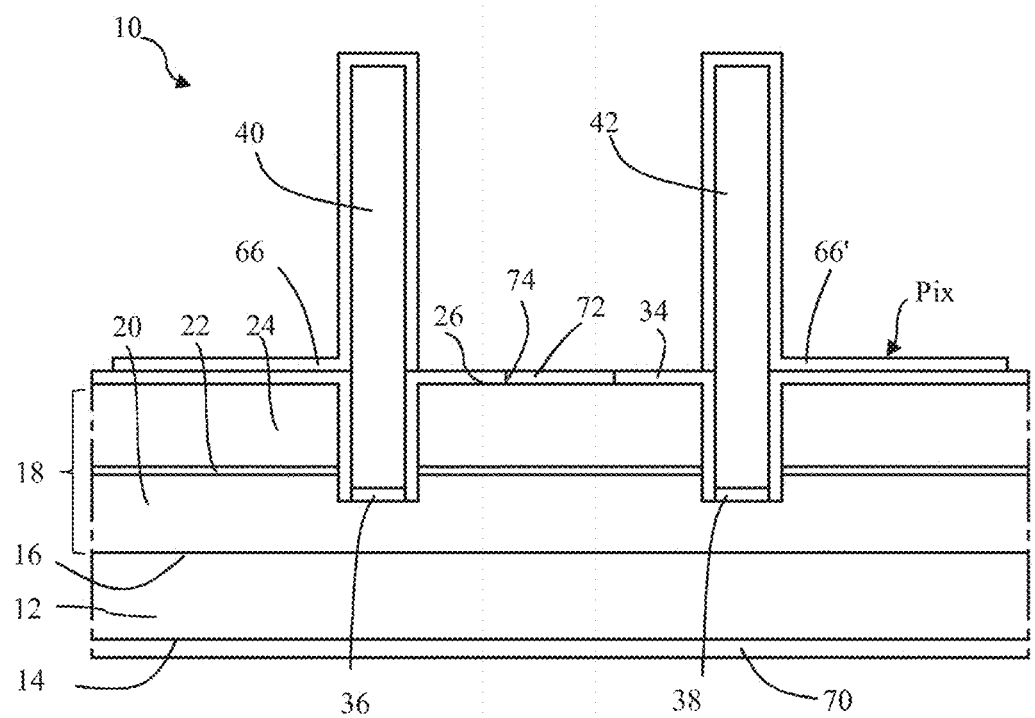
FIGS. 5 and 6 are respectively a partial simplified cross-section view and a partial simplified top view of an embodiment of an optoelectronic device.
Figure 6:
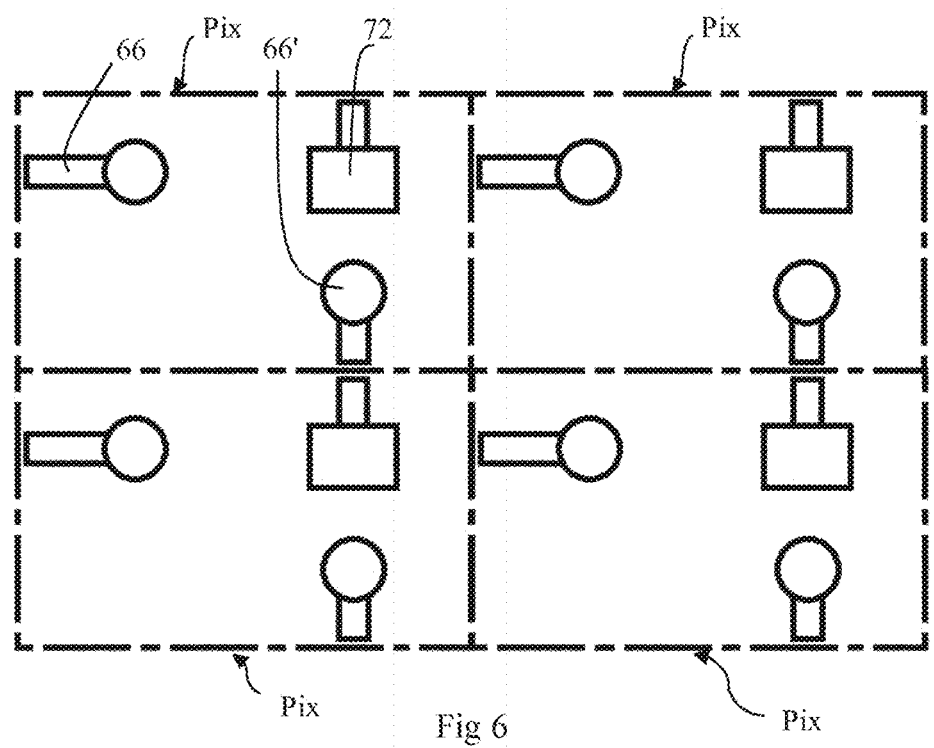

FIGS. 5 and 6 show an embodiment of the electrical connections of light-emitting diodes 18, 40, 42 of optoelectronic circuit 10. In the present embodiment, substrate 12 is electrically conductive and optoelectronic circuit 10 comprises an electrically conductive layer 70 covering face 14 of substrate 12 and in contact with face 14. Conductive layer 70 is a common electrode for light-emitting diodes 18, 40, 42. In the case when semiconductor layer 20 is doped of the N type, conductive layer 70 forms a common cathode for light-emitting diodes 18, 40 and 42.

FIGS. 5 and 6 show conductive layer 66 of light-emitting diode 40 and conductive layer 66' of light-emitting diode 42, which is separate from conductive layer 66 of light-emitting diode 40. Moreover, optoelectronic circuit 10 comprises an electrically conductive layer 72 in contact with face 26 of semiconductor layer 24, through an opening 74 made in insulating layer 34, and forming an electrode for light-emitting diode 18.

In operation, voltages or currents are applied between conductive layer 70 and conductive layers 66, 66' and 72, so that, for each pixel Pix, the active region of each light-emitting diode 18, 40, 42 emits light with an intensity that depends on the voltage applied between conductive layers 66, 66' and 72 associated respectively with light-emitting diode 18, 40, 42 and conductive layer 70. In the present embodiment, display pixels Pix can be arranged in an array and active matrix addressing scheme can be performed.

Figure 7:
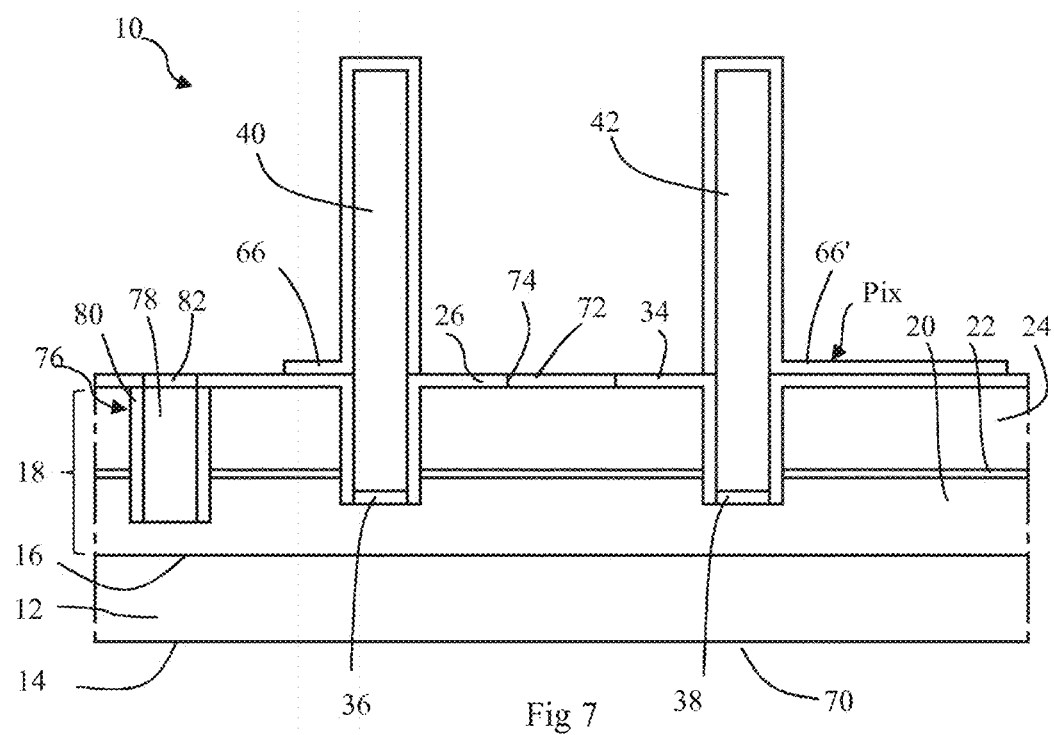
FIGS. 7 to 11 are partial simplified cross-section views of other embodiments of optoelectronic devices.

FIG. 7 shows a variation of the embodiment shown in FIGS. 5 and 6 when substrate 12 is electrically insulating. In FIG. 7, optoelectronic circuit 10 comprises a vertical isolated trench 76 totally crossing semiconductor layer 24 from face 26, totally crossing active region 22 and in contact at one end with semiconductor layer 20. Vertical isolated trench 76 comprises an electrically conducting core 78 in contact with semiconductor layer 20 and separated from semiconductor layer 24 and active region 22 by an electrically insulating wall 80. Moreover, optoelectronic circuit 10 comprises an electrically conductive layer 82 in contact with core 78. Electrically conductive layer 82 forms a common electrode for light-emitting diodes 18, 40 and 42.

Figure 8:
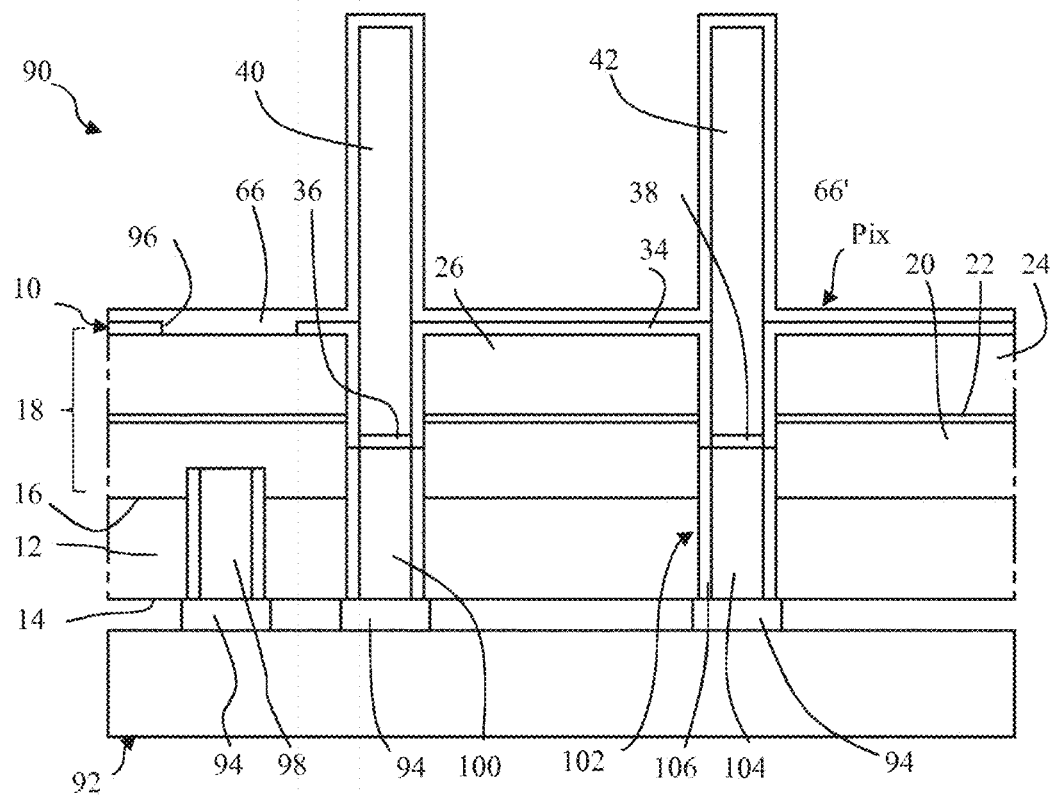

FIG. 8 shows another embodiment of the electrical connections of light-emitting diodes 18, 40, 42 of optoelectronic circuit 10. Substrate 12 can be electrically insulating.

Optoelectronic circuit 10 is part of an optoelectronic device 90 that further comprises another integrated circuit 92 comprising electronic components, not shown, especially transistors, used to control light-emitting diodes 18, 40, 42 of optoelectronic circuit 10. Integrated circuit 92 is called control circuit or control chip in the following description. Optoelectronic circuit 10 is bonded to control circuit 92. According to the bonding type, bounding pads 94 may be present between optoelectronic circuit 10 and control circuit 92. In the present embodiment, conductive layer 66 is common to light-emitting diodes 40 and 42. Conductive layer 66 is also in contact with face 26 of semiconductor layer 24, through an opening 96 made in insulating layer 34. Conductive layer 66 is a common electrode for light-emitting diodes 18, 40, 42. In the case when semiconductor layer 20 is doped of the N type, conductive layer 66 forms a common anode for light-emitting diodes 18, 40 and 42.

Optoelectronic circuit 10 further comprises vertical isolated trenches 98, 100, 102 crossing substrate 12 from face 14 to face 16, each vertical isolated trench 98, 100, 102 comprising an electrically conducting core 104 laterally insulated by an electrically insulating wall 106. Vertical isolated trench 98 is contact at one end with one of the bounding pad 94 and in contact at the opposite end with semiconductor layer 20. Vertical isolated trench 100 is contact at one end with one of the bounding pad 94 and in contact at the opposite end with seed pad 36. Vertical isolated trench 102 is contact at one end with one of the bounding pad 94 and in contact at the opposite end with seed pad 38.

In operation, voltages or currents are applied between conductive pads 94 linked to light-emitting diodes 18, 40, 42 and conductive layer 66, so that, for each pixel Pix, the active region of each light-emitting diode 18, 40, 42 emits light with an intensity that depends on the voltage applied between conductive pad 94 associated with said light-emitting diode 18, 40, 42 and conductive layer 66. In the present embodiment, display pixels Pix can be arranged in an array and active matrix addressing scheme can be performed.

Substrate 12 is at least partly made of a material that allows the growth by epitaxy of the semiconductor layers of light-emitting diode 18. Substrate 12 may be made of silicon, germanium, silicon carbide, sapphire, a III-V compound, a II-VI compound, or a combination of at least two of these compounds.

Substrate 12, wires 60, semiconductor layers 20, 24, 64 and active regions 22, 62 may be at least partly made of semiconductor materials mainly comprising a III-V compound, for example, a III-N compound, arsenide-based or phosphide-based compound. Examples of group-III elements comprise gallium (Ga), indium (In), or aluminum (Al). Examples of III-N compounds are GaN, AlN, InN, InGaN, AlGaN, or AlInGaN. An example of arsenide-based compound is Gallium Arsenide (GaAs). Examples of phosphide-based elements comprise aluminium (Al), gallium (Ga), indium (In) and phosphorus (P). Examples of phosphide-based compounds are AlInGaP, InGaP, GaP, or AlGaP. Other group-V elements may also be used, for example, phosphorus or arsenic. Generally, the elements in the III-V compound may be combined with different molar fractions.

Substrate 12, wires 60, semiconductor layers 20, 24, 64 and active regions 22, 62 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

The thickness of substrate 12 is in the range from 0 to 2 mm, preferably from 10 μm to 1 mm. The thickness of semiconductor layer 20 is in the range from 10 nm to 50 μm. The thickness of semiconductor layer 24 is in the range from 10 nm to 50 μm. The thickness of semiconductor layer 64 is in the range from 10 nm to 5 μm. The thickness of active region 22 is in the range from 5 nm to 1 μm. The thickness of active region 62 is in the range from 5 nm to 1 μm.

Seed pads 36, 38 are made of a material favoring the growth of wires 60. As an example, the material forming seed pads 36, 38 may be a nitride, a carbide, or a boride of a transition metal from column IV, V, or VI of the periodic table of elements or a combination of these compounds. As an example, seed pads 36, 38 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum nitride and carbide (TaCN), of magnesium nitride in $Mg_xN_y$ form, where x is approximately equal to 3 and y is approximately equal to 2, for example, magnesium nitride according to form $Mg_3N_2$ or magnesium gallium nitride (MgGaN), of tungsten (W), of tungsten nitride (WN), or of a combination thereof. Seed pads 36, 38 may be doped with the same conductivity type as substrate 12. Each seed pad 36, 38 may have a monolayer structure or may correspond to a stack of two layers or of more than two layers.

Active region 22 of light-emitting diode 18 is the layer having most of the radiation supplied by light-emitting diode 18 emitted therefrom. According to an example, active region 22 may comprise confinement means. Active region 22 may comprise a single quantum well, multiple quantum wells or a double heterostructure. It may then comprise a semiconductor material different from the semiconductor material forming semiconductor layers 20 and 24 and having a bandgap smaller than that of semiconductor layers 20 and 24. Active region 22 may comprise multiple quantum wells. It then comprises a stack of semiconductor layers forming an alternation of quantum wells and of barrier layers. Active region 62 may comprise a single quantum well, multiple quantum wells or a double heterostructure as disclosed before for active region 22.

Conductive layer 66, 66', 72 may be made of a transparent and conductive material such as graphene or a transparent conductive oxide (TCO), for example, indium tin oxide (ITO), gallium zinc oxide (GZO) or aluminum zinc oxide (AZO). As an example, conductive layer 66 has a thickness in the range from 5 nm to 1000 nm, preferably from 20 nm to 50 nm.

Conductive cores 78, 104 and conductive layer 70 are made of a conductive material, for example a metal such as aluminum, silver, copper, or zinc.

Insulating walls 80, 106 and insulating layer 34 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of aluminum oxide ($Al_2O_3$), of hafnium oxide ($HfO_2$) or of a combination thereof.

Figure 9:
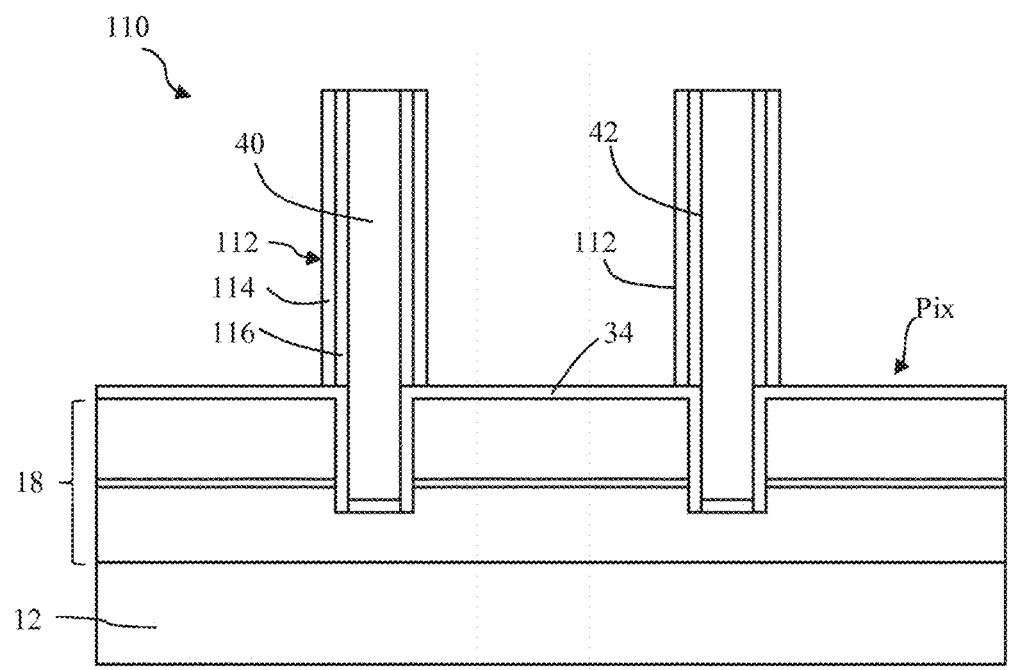

FIG. 9 shows another embodiment of an optoelectronic circuit 110 comprising all the elements of optoelectronic circuit 10, each light-emitting diode 40, 42 being further surrounded by a sleeve 112 comprising an electrically conductive layer 114 separated from light-emitting diode 40, 42 by an electrically insulating layer 116. Conductive layer 114 allows parasitic optical pumping to be prevented and insulating layer 116 allows to reduce absorption due to waveguiding effect. Conductive layer 114 may be made of a conductive material, for example a metal such as aluminum, silver, copper, or zinc. The thickness of conductive layer 114, measured in a direction parallel to face 26, is in the range from 5 nm to 1 µm, preferably from 10 nm to 200 nm.

Figure 10:
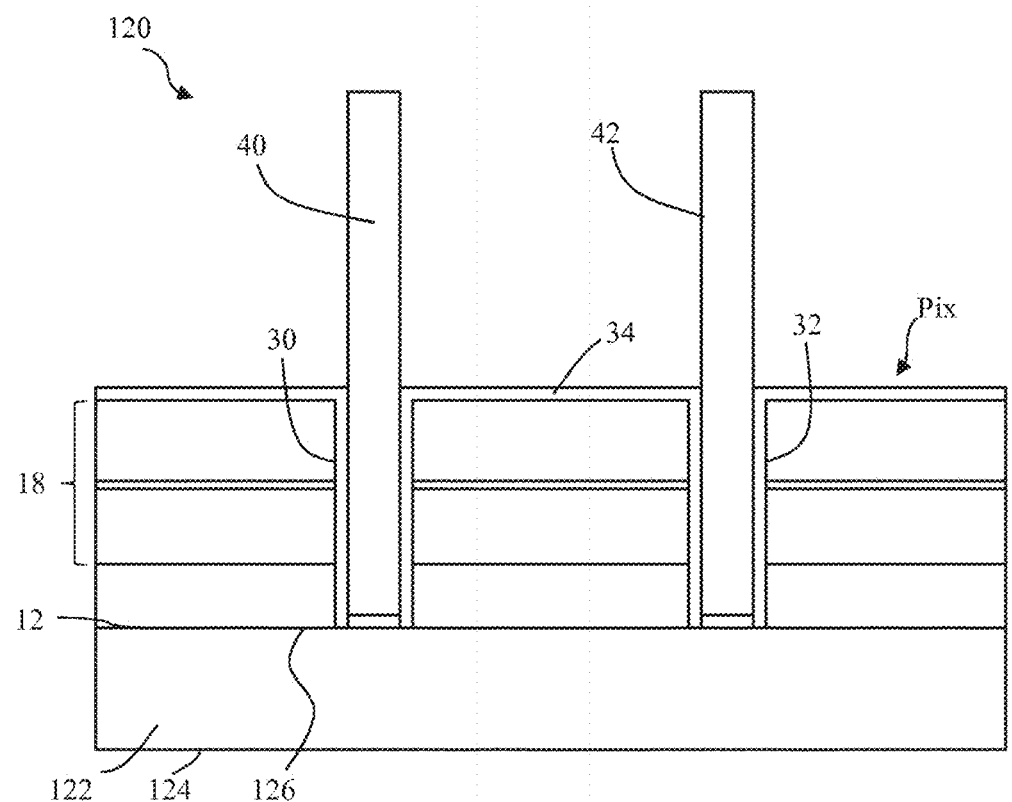

FIG. 10 shows another embodiment of an optoelectronic circuit 120 comprising all the elements of optoelectronic circuit 10 with the difference that it further comprises a supporting block 122 comprising opposite, preferably planar, faces 124, 126, face 14 of substrate 12 being in contact with face 126 and in that openings 30, 32 extend through semiconductor layer 20 and substrate 12 up to face 126. Seed pads 36, 38 are in contact with supporting block 122. Supporting block 122 is in a material adapted to the formation of light-emitting diodes 40, 42. Supporting block 122 is for example made of silicon, germanium, silicon carbide, a III-V compound, a II-VI compound, or a combination of at least two of these compounds.

Figure 11:
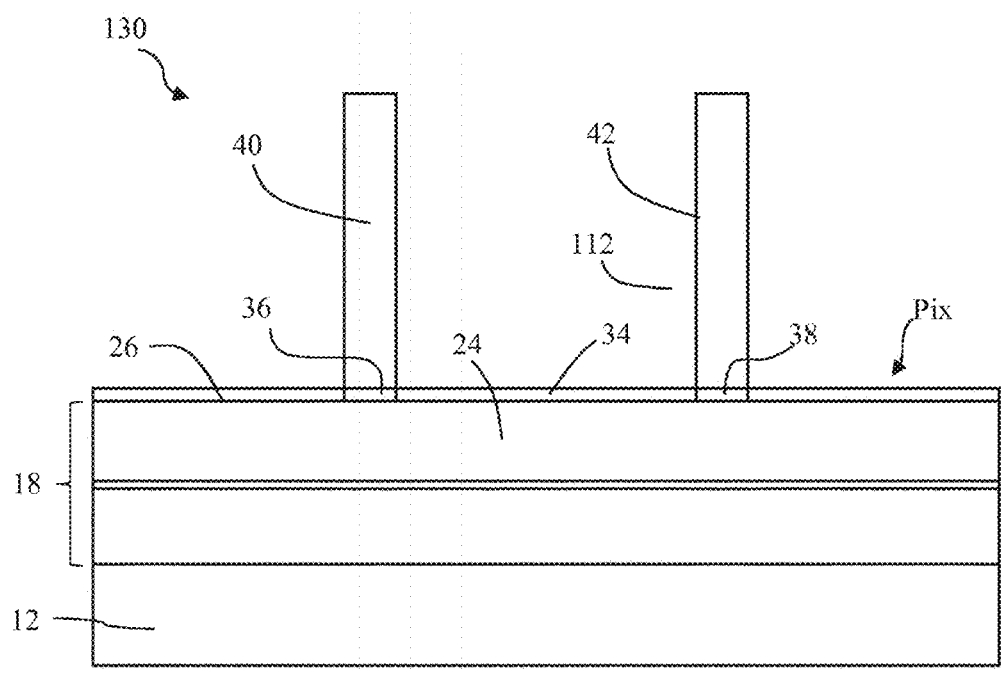

FIG. 11 shows another embodiment of an optoelectronic circuit 130 comprising all the elements of optoelectronic circuit 10 with the difference that seed pads 36, 38 rest on face 26 of semiconductor layer 24. Seed pads 36, 38 may not be present. Light-emitting diodes 40, 42 rest then directly on face 26.

As a variation, in the previously disclosed embodiments, a reflective layer can be provided between substrate 12 and semiconductor layer 20. Reflective layer allows light emitted by active region 22 of light-emitting diode 18 to be reflected towards face 26. When substrate 12 is transparent, the reflective layer can be put on face 14 of substrate 12.

FIGS. 12A to 12J are partial simplified cross-section views of the structures obtained at successive steps of an embodiment of a method of manufacturing the optoelectronic device shown in FIG. 8.

Figure 12A:
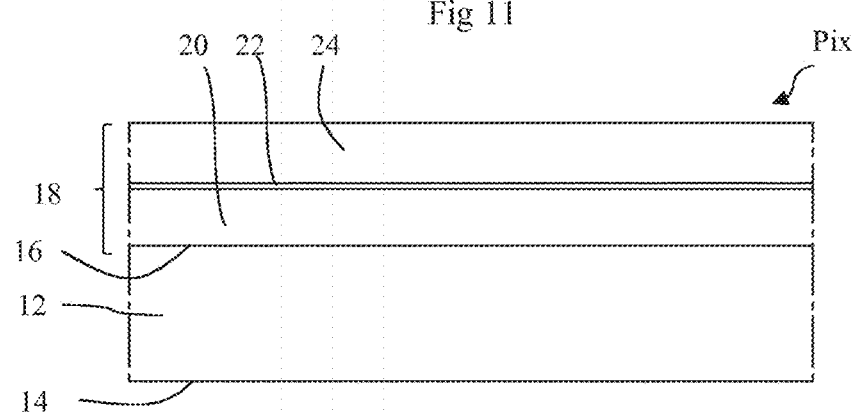
FIGS. 12A to 12J are partial simplified cross-section views of the structures obtained at successive steps of an embodiment of a method of manufacturing the optoelectronic device shown in FIG. 8.
Figure 12B:
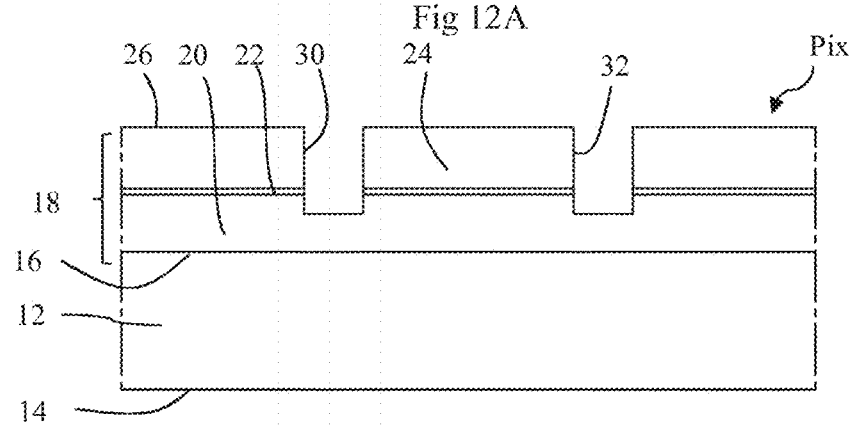
Figure 12C:
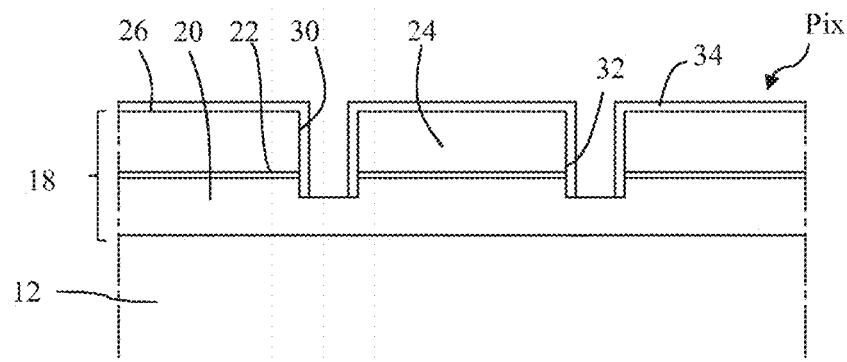
Figure 12D:
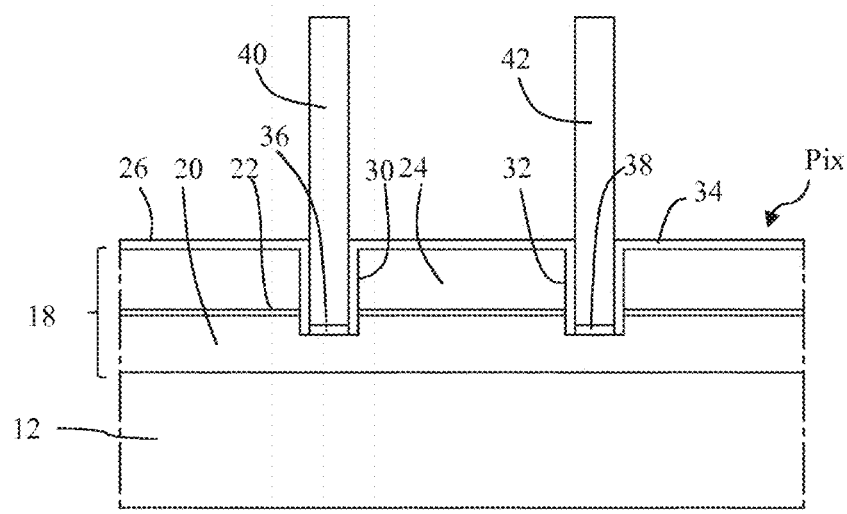
Figure 12E:
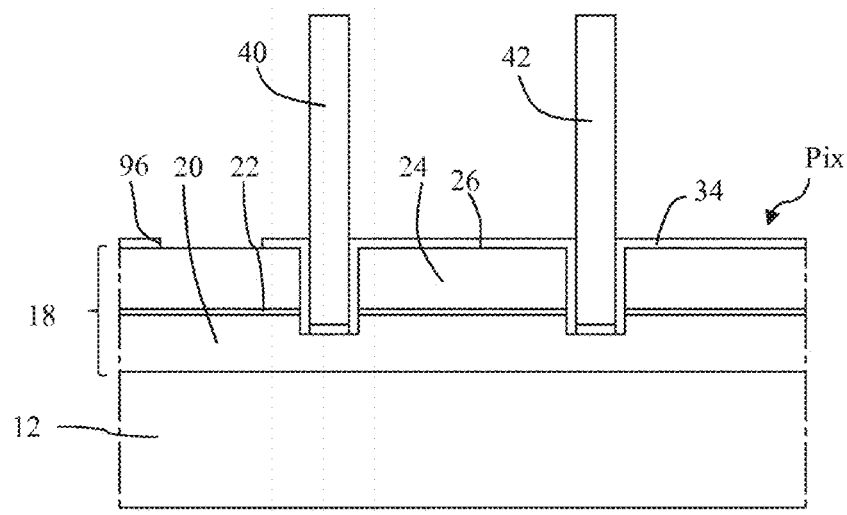
Figure 12F:
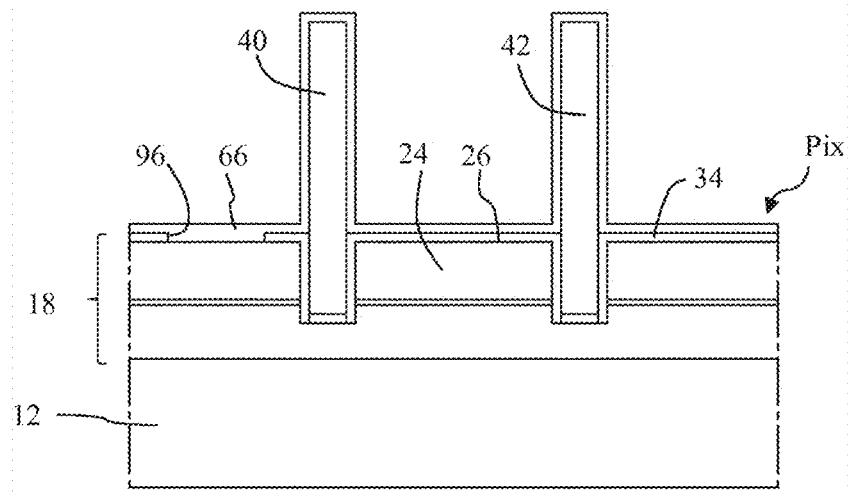
Figure 12G:
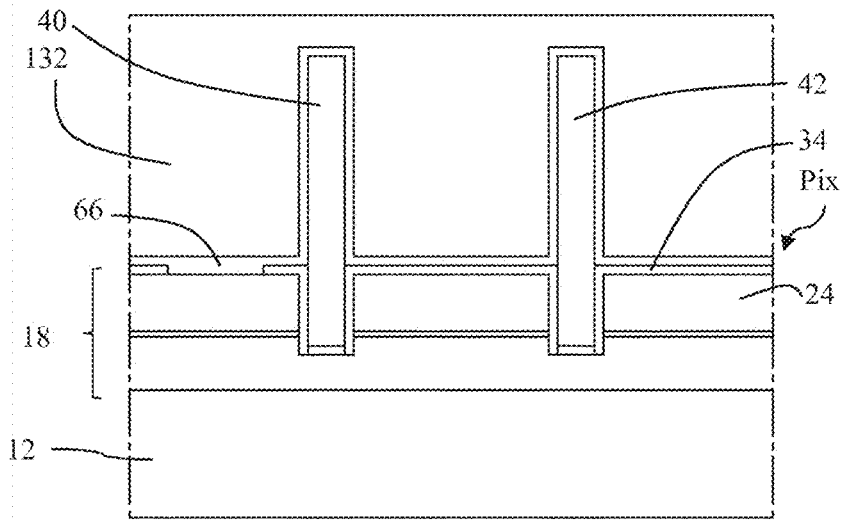
Figure 12H:
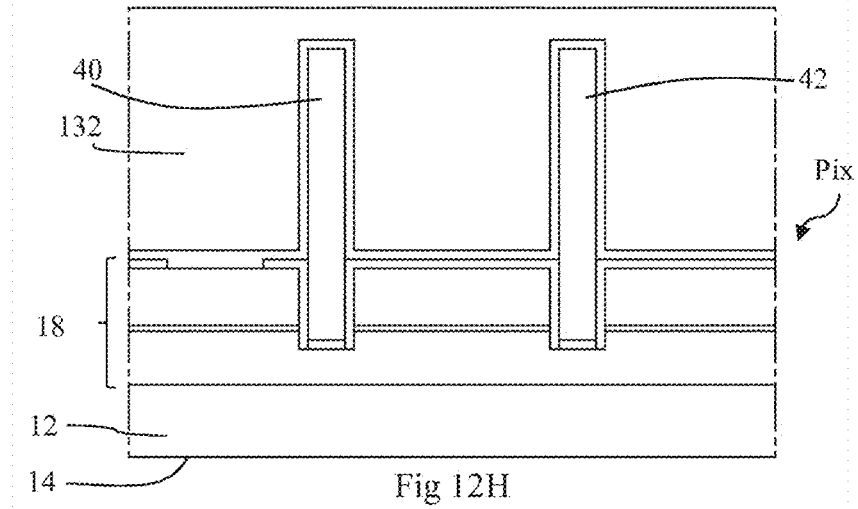
Figure 12I:
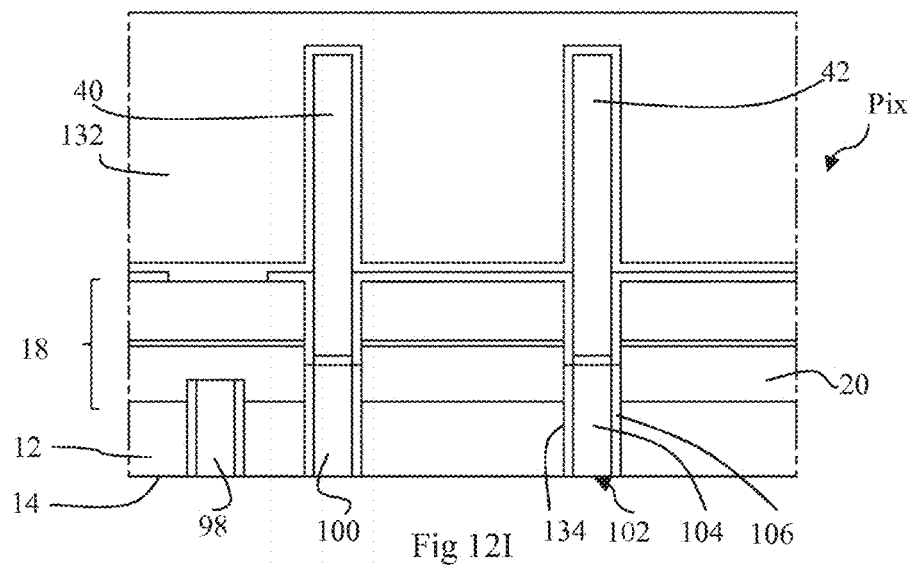
Figure 12J:
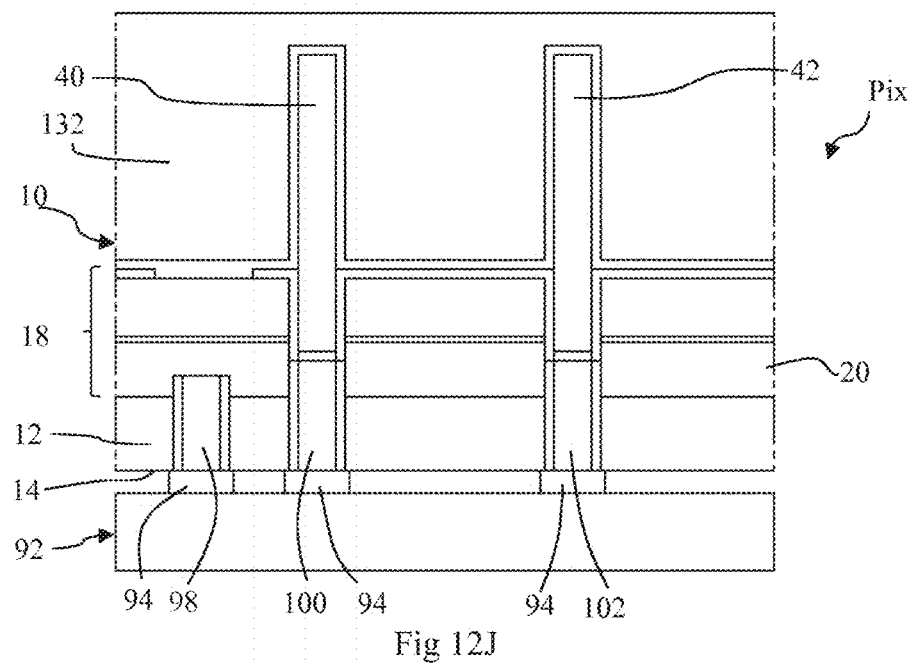

An embodiment of a method of manufacturing the optoelectronic device shown in FIG. 8 comprises the successive following steps, made for each display pixel Pix:

a) Forming light-emitting diode 18 on face 16 of substrate 12, preferentially using a growth method at low temperature (FIG. 12A). Layers of light-emitting diode 18 may be grown by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HYPE) may be used, as well as atomic layer deposition (ALD). Further, electrochemical processes may be used, for example, chemical bath deposition (CBD), hydrothermal processes, liquid aerosol pyrolysis, or electro-deposition. In an embodiment, semiconductor layer 20 of light-emitting diode 18 is linked to substrate 12 by an epitaxial relationship.

b) Forming openings 30, 32 extending from face 26 and crossing through semiconductor layer 24, active region 22 and stopping in semiconductor layer 20 (FIG. 12B). In another embodiment, openings 30, 32 can stop in semiconductor layer 24.

c) Forming insulating layer 34 on face 26 and on the lateral sides of openings 30, 32 (FIG. 12C).

d) Forming seed pads 36, 38 at the bottom of openings 30, 32 in contact with semiconductor layer 20 and forming light-emitting diodes 40, 42, except for electrode 66, on seed pads 36, 38, preferentially using a growth method at low temperature (FIG. 12D). Seed pads 36, 38 and light-emitting diodes 40, 42 may be grown by a method such as CVD, MOCVD, MBE, GSMBE, MOMBE, PAMBE, ALE, HVPE, ALD. Further, electrochemical processes may be used, for example CBD, hydrothermal processes, liquid aerosol pyrolysis, or electro-deposition. In an embodiment, seed pads 36, are linked to semiconductor layer 20 by an epitaxial relationship and semiconductor elements 60 of light-emitting diodes 40, 42 are linked to seed pads 36, 38 by an epitaxial relationship.

e) Forming opening 96 in insulating layer 34 to expose semiconductor layer 24 (FIG. 12E).

f) Forming conductive layer 66, on the structure shown in FIG. 12E, on insulating layer 34, on light-emitting diodes 40, 42 and in opening 96, conductive layer 66 being in contact with semiconductor layer 24 at the bottom of opening 96 (FIG. 12F).

g) Forming an encapsulation layer 132 on the structure shown in FIG. 12F (FIG. 12G). Thickness of encapsulation layer 132 is higher than the height of the parts of light-emitting diodes 40, 42 extending above conductive layer 66. Encapsulation layer 132 can be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of aluminum oxide ($Al_2O_3$) or of hafnium oxide ($HfO_2$), polymers such as benzocyclobutene (BCB) or an epoxy-based negative photoresist, for example SU-8 negative photoresist.

h) Thinning substrate 12 from face 14 (FIG. 12H).

i) Forming vertical isolated trenches 98, 100, 102 through substrate 12 and partially through semiconductor layer 20 (FIG. 12I). Vertical isolated trenches 98, 100, 102 can be formed by etching openings 134 through substrate 12 and partially through semiconductor layer 20 until reaching seed pads 36 and 38 for openings 100 and 102, covering the lateral sides of openings 134 with insulating walls 106 and forming conductive cores 104 inside openings 134. The implemented etching may be a dry etching, for example via a plasma based on $Cl_2$ or a reactive ion etching (RIE).

j) Binding control chip 92 to optoelectronic circuit 10 (FIG. 12J). In the present embodiment, the bonding of control chip 92 to optoelectronic circuit 10 is performed with use of inserts such as bounding pads 94. Alternatively, the bonding of control chip 92 to optoelectronic circuit 10 may be performed by direct bonding, with no use of inserts. The direct bonding may comprise a direct metal-to-metal bonding of metal areas of control chip 92 and metal areas of vertical isolated trenches 98, 100, 102 and a dielectric-to-dielectric bonding of the dielectric areas at the surface of optoelectronic circuit 10 and of the dielectric areas at the surface of control chip 92. The bonding of control chip 92 to optoelectronic circuit 10 may be performed by a thermocompression method where optoelectronic circuit 10 is placed against control chip 92, with a pressure and a heating being applied.

Since, for each display pixel Pix, light-emitting diode 18 is formed on the totality of substrate 12 and only light-emitting diodes 40, 42 need to be formed afterwards on specific locations, the epitaxy steps for manufacturing the light-emitting diodes are simpler with respect to an optoelectronic circuit in which all the light-emitting diodes have a tridimensional structure.

FIGS. 13A to 13K are partial simplified cross-section views of the structures obtained at successive steps of an embodiment of a method of manufacturing the optoelectronic device shown in FIG. 10.

Figure 13A:
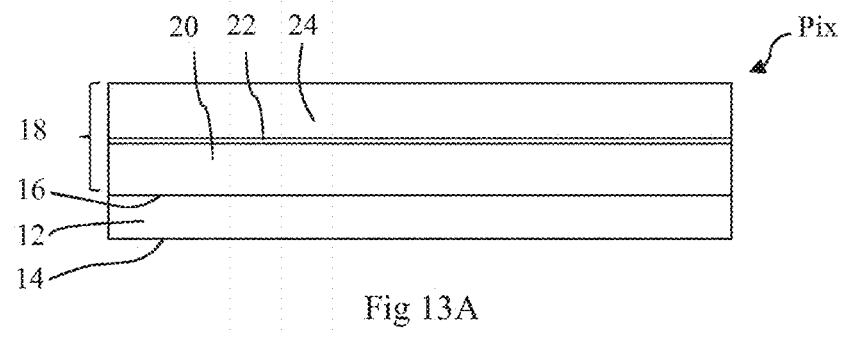
Figure 13B:
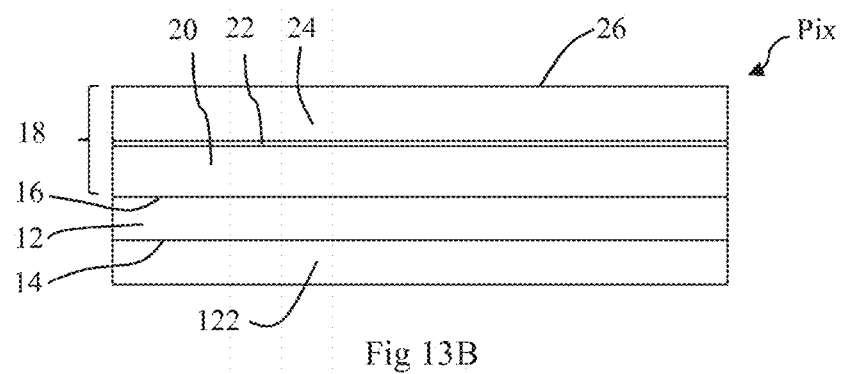
Figure 13C:
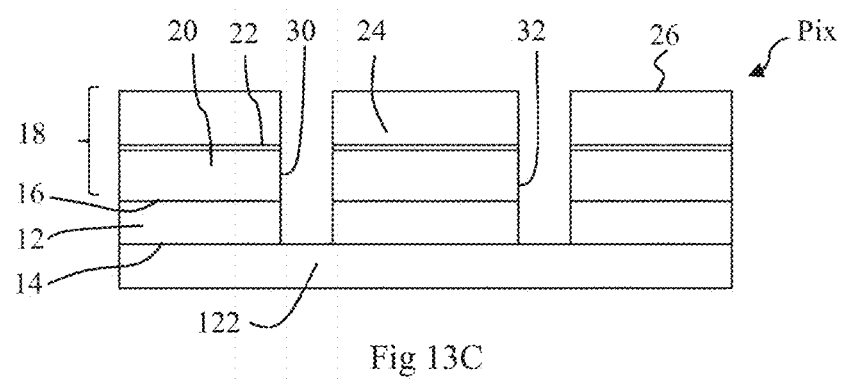
Figure 13D:
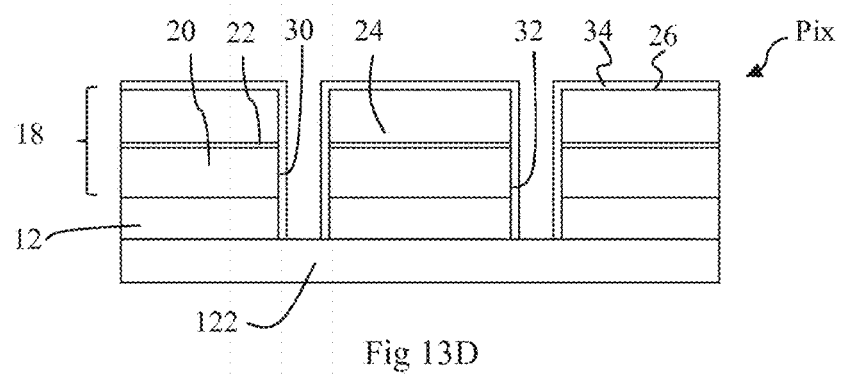
Figure 13E:
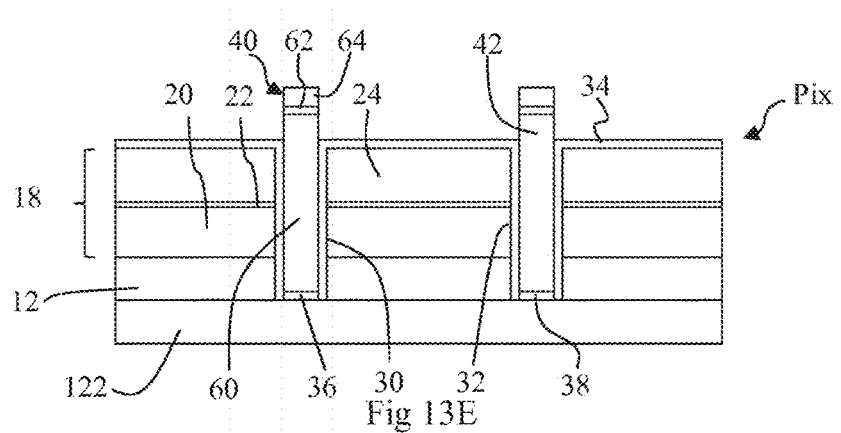
Figure 13J:
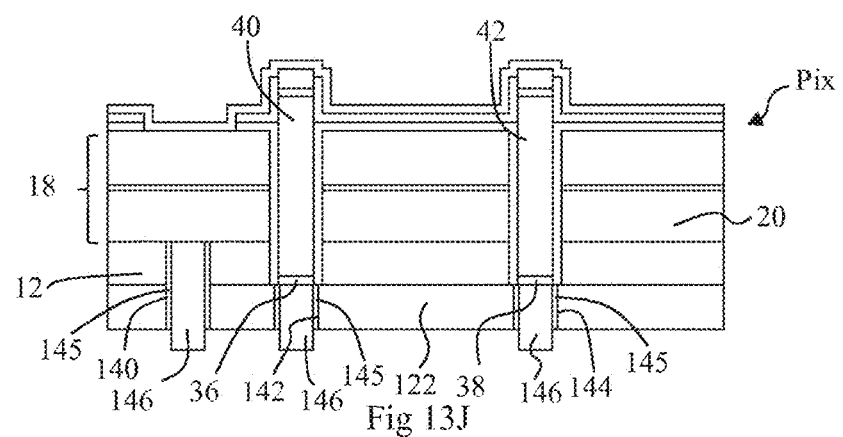
Figure 13K:
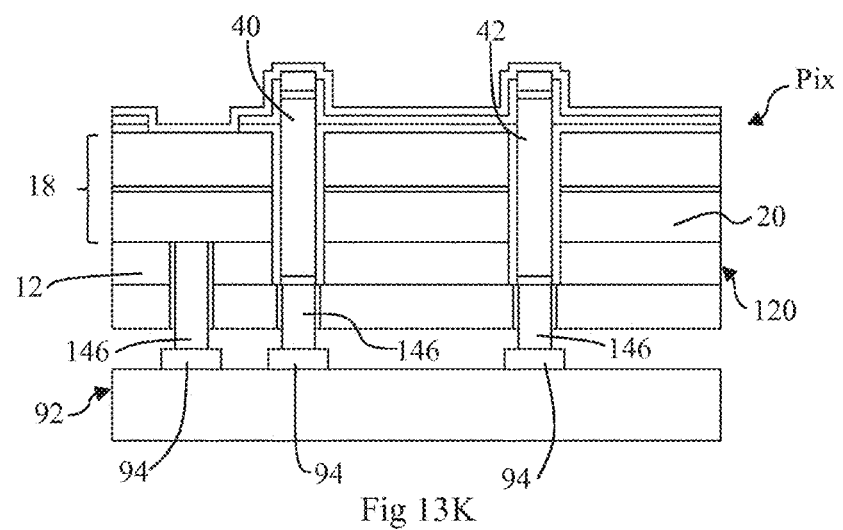

An embodiment of a method of manufacturing the optoelectronic device shown in FIG. 10 comprises the successive following steps, made for each display pixel Pix:

a') Forming light-emitting diode 18 on face 16 of substrate 12, preferentially using a growth method at low temperature as in step a) previously disclosed (FIG. 13A).

b') Binding substrate 12 to supporting block 122 (FIG. 13B). Substrate 12 can be thinned down before the binding step. The bonding of substrate 12 to supporting block 122 may be performed by direct bonding.

c') Forming openings 30, 32 extending from face 26 and crossing through semiconductor layer 24, active region 22, semiconductor layer 20, substrate 12 and stopping at supporting block 122 (FIG. 13C).

d') Forming insulating layer 34 on face 26 and on the lateral sides of openings 30, 32 (FIG. 13D).

e') Forming seed pads 36, 38 at the bottom of openings 30, 32 in contact with supporting block 122 and forming light-emitting diodes 40, 42, except for electrode 66, on seed pads 36, 38, preferentially using a growth method at low temperature (FIG. 13E). Seed pads 36, 38 and light-emitting diodes 40, 42 may be grown by a method such as CVD, MOCVD, MBE, GSMBE, MOMBE, PAMBE, ALE, HVPE, ALD. Further, electrochemical processes may be used, for example CBD, hydrothermal processes, liquid aerosol pyrolysis, or electro-deposition. In an embodiment, seed pads 36, are linked to semiconductor layer 20 by an epitaxial relationship and semiconductor elements 60 of light-emitting diodes 40, 42 are linked to seed pads 36, 38 by an epitaxial relationship. In FIG. 13E, light-emitting diodes 40, 42 have an axial configuration. When light-emitting diode 18 emits red light, active region 22 advantageously comprises InGaN layers rather than AlInGaP layers, so that the formation of light-emitting diodes 40, 42 at temperature higher than 1000° C. is possible.

f') Forming an electrically insulating layer 136 covering the parts of light-emitting diodes 40, 42 extending outside openings 30, 32 and covering insulating layer 34 between light-emitting diodes 40, 42 (FIG. 13F).

g') Forming opening 96 in insulating layers 136 and 34 to expose semiconductor layer 24 and forming openings 138 in insulating layer 136 to expose semiconductor layer 64 of each light-emitting diode 40, 42 (FIG. 13G).

h') Forming conductive layer 66 on the structure shown in FIG. 13G on insulating layer 136, in opening 96 and in openings 138, conductive layer 66 being in contact with semiconductor layer 24 at the bottom of opening 96 and in contact with semiconductor layer 64 of each light-emitting diode 40, 42 through openings 138 (FIG. 13H).

i') Forming openings 140, 142, 144 through supporting block 122 and, only for opening 140, through substrate 12 and forming electrically insulating layers 145 on the lateral sides of openings 140, 142, 144 (FIG. 13I). Opening 142 exposes seed pad 36 and opening 144 exposes seed pad 38. The implemented etching may be a dry etching, for example via a plasma based on $Cl_2$ or a reactive ion etching (RIE). As a variation, seed pads 36 and 38 may also be removed when forming openings 140, 142, 144.

j') Forming bounding pads 146 in openings 140, 142, 144 (FIG. 13J), bounding pad 146 inside opening 140 being in contact with semiconductor layer 20, bounding pad 146 inside opening 142 being in contact with seed pad 36 and bounding pad 146 inside opening 144 being in contact with seed pad 38. Bounding pads 146 project outside openings 140, 142, 144.

k') Binding control chip 92 to optoelectronic circuit 120 (FIG. 13K). In the present embodiment, the bonding of control chip 92 to optoelectronic circuit 120 is performed with use of bounding pads 94 that are bounded to bounding pads 146.

As a variation, an additional layer can be formed on the lateral sides of openings 30, 32, 140, 142, 144, this layer being opaque to the light emitted by light-emitting diodes 40 and 42 to optimize color output.

Specific embodiments have been described. Various alterations and modifications will occur to those skilled in the art. In particular, although in the previously-described embodiments, semiconductor elements 60 have a wire-shaped, semiconductor elements 60 could have a different shape, for example a pyramid-shaped.

Moreover, several embodiments with various alterations have been described. Some elements of these embodiments and alterations can be combined. As an example, the embodiments of electric connections shown on FIGS. 5 to 8 can be applied to any embodiments of the optoelectronic circuit shown on FIGS. 9 to 11.

The invention claimed is:

1. An optoelectronic circuit comprising a substrate and display pixels, each display pixel comprising a first light-emitting diode adapted to emit a first radiation and a second light-emitting diode adapted to emit a second radiation, the first light-emitting diode having a planar structure and resting on the substrate and the second light-emitting diode having a tridimensional structure and crossing at least partially through the first light-emitting diode, wherein the substrate comprises opposite first and second faces, wherein the first light-emitting diode comprises a first active region adapted to emit the first radiation, wherein the second light-emitting diode comprises a second active region adapted to emit the second radiation, and wherein the surface area, viewed from a direction orthogonal to the first face, of the first active region is at least twice as big as the surface area, viewed from said direction, of the second active region, wherein the first light-emitting diode comprises first and second semiconductor planar layers, the first active region being sandwiched between first and second semiconductor planar layers and wherein the second light-emitting diode comprises a tridimensional semiconductor element, the second active region covering at least partially the tridimensional semiconductor element, the tridimensional element crossing at least partially through the first light-emitting diode, and wherein the first semiconductor planar layer is in contact with the substrate and wherein each display pixel comprises an opening extending through the second semiconductor planar layer, through the first active region and at least partially through the first semiconductor planar layer, the tridimensional semiconductor element extending at least inside the opening.

2. The optoelectronic circuit of claim 1, wherein each display pixel further comprises a third light-emitting diode adapted to emit a third radiation, having a tridimensional structure and resting on the first light-emitting diode or crossing at least partially through the first light-emitting diode.

3. The optoelectronic circuit of claim 2, wherein one of the first, second and third radiations is at a wavelength in the range from 600 nm to 720 nm, wherein another one of the first, second and third radiations is at a wavelength in the range from 510 nm to 570 nm and wherein another one of the first, second and third radiations is at a wavelength in the range from 430 nm to 490 nm.

4. The optoelectronic circuit of claim 1, comprising an electrically conductive layer covering the second light-emitting diode and electrically connected to the second light-emitting diode.

5. The optoelectronic circuit of claim 4, wherein the electrically conductive layer is further in contact with the first light-emitting diode.

6. The optoelectronic circuit of claim 1, wherein the first light-emitting diode and the second light-emitting diode comprise at least one quantum well.

7. The optoelectronic circuit of claim 1, wherein each display pixel comprises an electrically conductive element extending through the substrate and electrically linked to the second light-emitting diode.

8. The optoelectronic circuit of claim 1, wherein each display pixel further comprises a metallic wall laterally surrounding at least part of the second light-emitting diode.

9. The optoelectronic circuit of claim 8, wherein each display pixel (Pix) further comprises an electrically insulating layer interposed between the metallic wall and the second light-emitting diode.

10. An optoelectronic device comprising the optoelectronic circuit according to claim 1 and comprising an additional circuit bounded to the optoelectronic circuit on the side of the substrate opposite to the first light-emitting diode.

11. A method of manufacturing an optoelectronic circuit comprising a substrate and display pixels, the method comprising for each display pixel the successive steps of:

forming on the substrate a first light-emitting diode adapted to emit a first radiation and having a planar structure; and forming a second light-emitting diode adapted to emit a second radiation, having a tridimensional structure and crossing at least partially through the first light-emitting diode, wherein the substrate comprises opposite first and second faces, wherein the first light-emitting diode comprises a first active region adapted to emit the first radiation, wherein the second light-emitting diode comprises a second active region adapted to emit the second radiation, and wherein the surface area, viewed from a direction orthogonal to the first face, of the first active region is at least twice as big as the surface area, viewed from said direction, of the second active region, wherein the first light-emitting diode comprises first and second semiconductor planar layers, the first active region being sandwiched between first and second semiconductor planar layers and wherein the second light-emitting diode comprises a tridimensional semiconductor element, the second active region covering at least partially the tridimensional semiconductor element, the tridimensional element crossing at least partially through the first light-emitting diode, and wherein the first semiconductor planar layer is in contact with the substrate and wherein each display pixel comprises an opening extending through the second semiconductor planar layer, through the first active region and at least partially through the first semiconductor planar layer, the tridimensional semiconductor element extending at least inside the opening.

12. The method according to claim 11, wherein the first and second light-emitting diodes are formed by epitaxy.

* * * * *